US010686081B2

(12) United States Patent
Wang (10) Patent No.: US 10,686,081 B2
(45) Date of Patent: Jun. 16, 2020

(54) SEMICONDUCTOR DEVICE, MOS CAPACITOR, AND MANUFACTURING METHODS THEREFOR

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/979,756

(22) Filed: May 15, 2018

(65) Prior Publication Data
US 2018/0374964 A1 Dec. 27, 2018

(30) Foreign Application Priority Data
Jun. 27, 2017 (CN) .......................... 2017 1 0511742

(51) Int. Cl.
*H01L 29/94* (2006.01)
*H01L 21/8234* (2006.01)
(Continued)

(52) U.S. Cl.
CPC .......... *H01L 29/94* (2013.01); *H01L 21/0332* (2013.01); *H01L 21/31111* (2013.01);
(Continued)

(58) Field of Classification Search
CPC ............ H01L 29/94; H01L 21/823431; H01L 21/823437; H01L 21/823487;
(Continued)

(56) References Cited

U.S. PATENT DOCUMENTS

2014/0346458 A1\* 11/2014 Park .................... H01L 27/1259
257/40
2018/0151745 A1\* 5/2018 Chang ............... H01L 29/78391

\* cited by examiner

*Primary Examiner* — Phat X Cao
(74) *Attorney, Agent, or Firm* — Brinks Gilson & Lione (57) ABSTRACT

This application relates to the technical field of semiconductors, and discloses a semiconductor device, an MOS capacitor, and manufacturing methods therefor. Forms of a method for manufacturing the device may include: providing a substrate structure, including: a first fin and a second fin that are on the substrate and that are separated; a first pseudo gate structure on the first fin, including a first pseudo gate dielectric layer and a first pseudo gate thereon; a second pseudo gate structure on the second fin, including a second pseudo gate dielectric layer and a second pseudo gate thereon; and an interlayer dielectric layer around the first pseudo gate structure and the second pseudo gate structure, an upper surface of the interlayer dielectric layer is approximately flush with upper surfaces of the first pseudo gate and the second pseudo gate; removing a portion of the first pseudo gate to form a first recess, and removing the second pseudo gate structure to form a second recess, where an upper surface of a remaining portion of the first pseudo gate is higher than an upper surface of the first pseudo gate dielectric layer that is at a top portion of the first fin; and forming a first metal gate stack structure in the first recess, and forming a second metal gate stack structure in the second recess.

16 Claims, 10 Drawing Sheets

(51) Int. Cl.
*H01L 21/311* (2006.01)
*H01L 21/3213* (2006.01)
*H01L 27/06* (2006.01)
*H01L 21/033* (2006.01)
*H01L 29/66* (2006.01)
*H01L 29/06* (2006.01)

(52) U.S. Cl.
CPC .. *H01L 21/32133* (2013.01); *H01L 21/32139* (2013.01); *H01L 21/823431* (2013.01); *H01L 21/823437* (2013.01); *H01L 27/0629* (2013.01); *H01L 29/0649* (2013.01); *H01L 29/0657* (2013.01); *H01L 29/66181* (2013.01); *H01L 29/66189* (2013.01); *H01L 29/66545* (2013.01)

(58) Field of Classification Search
CPC ......... H01L 21/823821; H01L 27/0733; H01L 27/10826
See application file for complete search history.

SEMICONDUCTOR DEVICE, MOS CAPACITOR, AND MANUFACTURING METHODS THEREFOR

RELATED APPLICATIONS

The present application claims priority to Chinese Patent Appln. No. 201710511742.4, filed Jun. 27, 2017, the entire disclosure of which is hereby incorporated by reference.

BACKGROUND

Technical Field

The present application relates to the technical field of semiconductors, and in particular, to a semiconductor device, an MOS (metal-oxide-semiconductor) capacitor, and manufacturing methods therefor.

Related Art

A gate-last high-k (dielectric constant) metal gate process becomes a standard process of a process flow of current fin field effect transistors (FinFET).

In the gate-last process, a pseudo gate dielectric layer and a pseudo gate are first formed, and then a source region and a drain region are formed. Subsequently, the pseudo gate dielectric layer and the pseudo gate are replaced with a high-k dielectric layer and a metal gate.

SUMMARY

An objective of the present application is providing an MOS capacitor applicable to the FinFET process and a method for manufacturing an MOS capacitor.

In one aspect of this application, a method for manufacturing a semiconductor device is provided. The method may include: providing a substrate structure, where the substrate structure includes: a first fin and a second fin that are on the substrate and that are separated; a first pseudo gate structure on the first fin, including a first pseudo gate dielectric layer on the first fin and a first pseudo gate on the first pseudo gate dielectric layer; a second pseudo gate structure that is on the second fin and that is separated from the first pseudo gate structure, including a second pseudo gate dielectric layer on the second fin and a second pseudo gate on the second pseudo gate dielectric layer; and an interlayer dielectric layer around the first pseudo gate structure and the second pseudo gate structure, where an upper surface of the interlayer dielectric layer is approximately flush with upper surfaces of the first pseudo gate and the second pseudo gate; removing a portion of the first pseudo gate to form a first recess, and removing the second pseudo gate structure to form a second recess, where an upper surface of a remaining portion of the first pseudo gate is higher than an upper surface of the first pseudo gate dielectric layer that is at a top portion of the first fin; and forming a first metal gate stack structure in the first recess, and forming a second metal gate stack structure in the second recess.

In some implementations, the method further includes: removing a portion of the first pseudo gate to form a first recess, and removing the second pseudo gate structure to form the second recess includes: performing a first etching, where the first etching removes a portion of the first pseudo gate to form the first recess, and removes a portion of the second pseudo gate to form a third recess; performing a second etching, where the second etching removes a remaining portion of the second pseudo gate to form a fourth recess; and performing a third etching, where the third etching removes the second pseudo gate dielectric layer, so as to form the second recess.

In some implementations, performing a second etching includes: forming a mask layer at a bottom portion and a side wall of the first recess; and performing the second etching by using the mask layer as a mask.

In some implementations, the method further includes: forming, after the mask layer is formed, a spacer layer on the mask layer that is at the side wall of the first recess.

In some implementations, the third etching further removes the mask layer that is on the bottom portion of the first recess.

In some implementations, the material of the mask layer includes an oxide; and the material of the spacer layer includes a nitride.

In some implementations, the remaining portion of the first pseudo gate includes a first portion and a second portion, where an upper surface of the first portion is approximately flush with that of the interlayer dielectric layer, and the upper surface of the second portion is a bottom portion of the first recess.

In some implementations, the method further includes: forming a contact that extends to the first portion.

In some implementations, the method further includes: doping, before the forming a first metal gate stack structure in the first recess, the remaining portion of the first pseudo gate that is below a bottom portion of the first recess.

In some implementations, the first metal gate stack structure includes: a first interfacial layer at a bottom portion of the first recess; a first gate dielectric layer on the first interfacial layer and a side wall of the first recess; and a first metal gate on the first gate dielectric layer.

In some implementations, the second metal gate stack structure includes: a second interfacial layer at a surface of the second fin; a second gate dielectric layer on the second interfacial layer and a bottom portion and a side wall of the second recess; and a second metal gate on the second gate dielectric layer.

In another aspect of this application, a method for manufacturing an MOS capacitor is provided. The method may include: providing a substrate structure, where the substrate structure includes: a fin on a substrate; a pseudo gate structure on the fin, including a pseudo gate dielectric layer on the fin and a pseudo gate on the pseudo gate dielectric layer; and an interlayer dielectric layer around the pseudo gate structure, where an upper surface of the interlayer dielectric layer is approximately flush with that of the pseudo gate; removing a portion of the pseudo gate to form a recess, where an upper surface of a remaining portion of the pseudo gate is higher than an upper surface of the pseudo gate dielectric layer that is at a top portion of the fin; and forming a metal gate stack structure in the recess.

In some implementations, the remaining portion of the pseudo gate includes a first portion and a second portion, where an upper surface of the first portion is approximately flush with that of the interlayer dielectric layer, and the upper surface of the second portion is a bottom portion of the recess.

In some implementations, the method further includes: forming a contact that extends to the first portion.

In some implementations, the method further includes: forming a spacer layer at a side wall of the recess before the forming a metal gate stack structure in the recess.

In some implementations, the method further includes: doping, before the forming a metal gate stack structure in the recess, the remaining portion of the pseudo gate that is below a bottom portion of the recess.

In some implementations, the metal gate stack structure includes: an interfacial layer at a bottom portion of the recess; a gate dielectric layer at the interfacial layer and a side wall of the recess; and a metal gate on the gate dielectric layer.

In still another aspect of this application, an MOS capacitor is provided, including: a first fin on a substrate; a first pseudo gate structure on the first fin, including a first pseudo gate dielectric layer on the first fin; and a first pseudo gate on the first pseudo gate dielectric layer; an interlayer dielectric layer around the first pseudo gate structure and having a first recess that exposes the first pseudo gate; and a first metal gate stack structure in the first recess.

In some implementations, the first pseudo gate includes: a first portion, where an upper surface is approximately flush with an upper surface of the interlayer dielectric layer; and a second portion, where an upper surface is a bottom portion of the first recess.

In some implementations, the MOS capacitor further includes: a contact that extends to the first portion.

In some implementations, the first metal gate stack structure includes: a first interfacial layer at a bottom portion of the first recess; a first gate dielectric layer on the first interfacial layer and a side wall of the first recess; and a first metal gate on the first gate dielectric layer.

In some implementations, the MOS capacitor further includes: a spacer layer between the side wall of the first recess and the first gate dielectric layer.

In yet another aspect of this application, a semiconductor device is provided, including: the MOS capacitor according to any one of the foregoing embodiments.

In some implementations, the device further includes: a second fin that is on the substrate and that is separated from the first fin; the interlayer dielectric layer further around the second fin, and having a second recess that exposes the second fin; and a second metal gate stack structure in the second recess.

In some implementations, the second metal gate stack structure includes: a second interfacial layer at a surface of the second fin; a second gate dielectric layer on the second interfacial layer and a bottom portion and a side wall of the second recess; and a second metal gate on the second gate dielectric layer.

Embodiments and implementations of this application provide a method for manufacturing an MOS capacitor that is applicable to the FinFET process. In a process of forming a FinFET based on a second fin, a first pseudo gate dielectric layer and a portion of a first pseudo gate are remained, so that an MOS capacitor is formed in the process of forming the FinFET.

The exemplary embodiments and implementations of this application are described in detail below with reference to the accompanying drawings, so that other features, aspects, and advantages of this application become clear.

BRIEF DESCRIPTION OF THE DRAWINGS

The accompanying drawings, which constitute a part of the specification, illustrate exemplary embodiments and forms of this application and, together with the specification, serve to explain the principles of this application. In the accompanying drawings.

DETAILED DESCRIPTION

Exemplary embodiments and forms of the present application are described in detail with reference to the accompanying drawings. It should be understood that unless being described in detail, relative layouts, mathematical expressions, and numeric values of components and steps described in these embodiments and forms should not be understood as a limitation to the scope of this application.

In addition, it should be understood that for ease of description, sizes of the components shown in the accompanying drawings are not necessarily drawn according to an actual proportional relationship. For example, thicknesses or widths of some layers may be magnified with respect to other layers.

The following descriptions about the exemplary embodiments and forms are only illustrative, and should not be used as a limitation on this application and applications or uses of this application in any sense.

Technologies, methods, and devices that are known by a person of ordinary skill in the related fields may not be discussed in detail. However, in cases in which the technologies, methods, and devices are applicable, the technologies, methods, and devices should be considered as a part of the specification.

It should be noted that similar reference signs and letters represent similar items in the following accompanying drawings. Therefore, once an item is defined or described in a figure, the item does not need to be further discussed in the descriptions of the subsequent figures.

Figure 1:
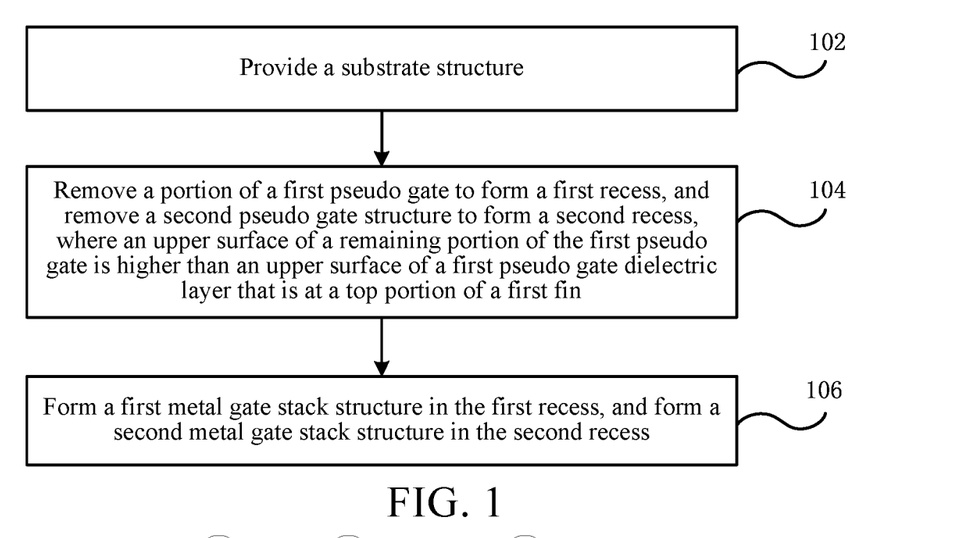
FIG. 1 is a simplified flowchart of a method for manufacturing a semiconductor device.

FIG. 1 is a simplified flowchart of a method for manufacturing a semiconductor device. FIG. 2 to FIG. 11 show schematic diagrams at phases of a method for manufacturing a semiconductor device.

A method for manufacturing a semiconductor device is described in detail below with reference to FIG. 1 and FIG. 2 to FIG. 11.

As shown in FIG. 1, first, in step 102: Provide a substrate structure.

A specific implementation of forming the substrate structure is described below with reference to FIG. 2 to FIG. 4.

Figure 2:
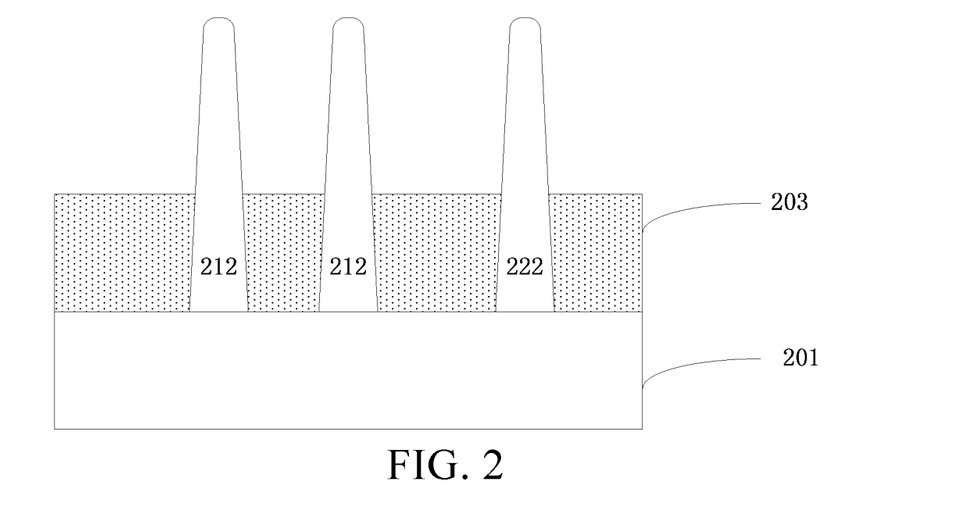
FIG. 2 to FIG. 11 show schematic diagrams at phases of a method for manufacturing a semiconductor device.

As shown in FIG. 2, a fin 212 and a fin 222 that are on a substrate 201 are formed. The fin 212 may be referred to as a first fin 212, and the fin 222 may be referred to as a second fin 222. Herein, an isolation region 203 may be provided around the first fin 212 and the second fin 222. In some implementations, the first fin 212 may be used as a fin of an MOS capacitor, and the second fin 222 may be used as a fin of a FinFET.

The substrate 201 may be, for example, an element semiconductor substrate such as a silicon substrate or a germanium substrate, or may be a compound semiconductor substrate such as gallium arsenide. The materials of the first fin 212 and the second fin 222 may be semiconductor materials that are same to the material of the substrate 201, or may be semiconductor materials that are different from the material of the substrate 201. The first fin 212 and the second fin 222 may be formed in a manner of etching the substrate 201, or may be formed in a manner of epitaxially growing on the substrate 201.

Figure 3:
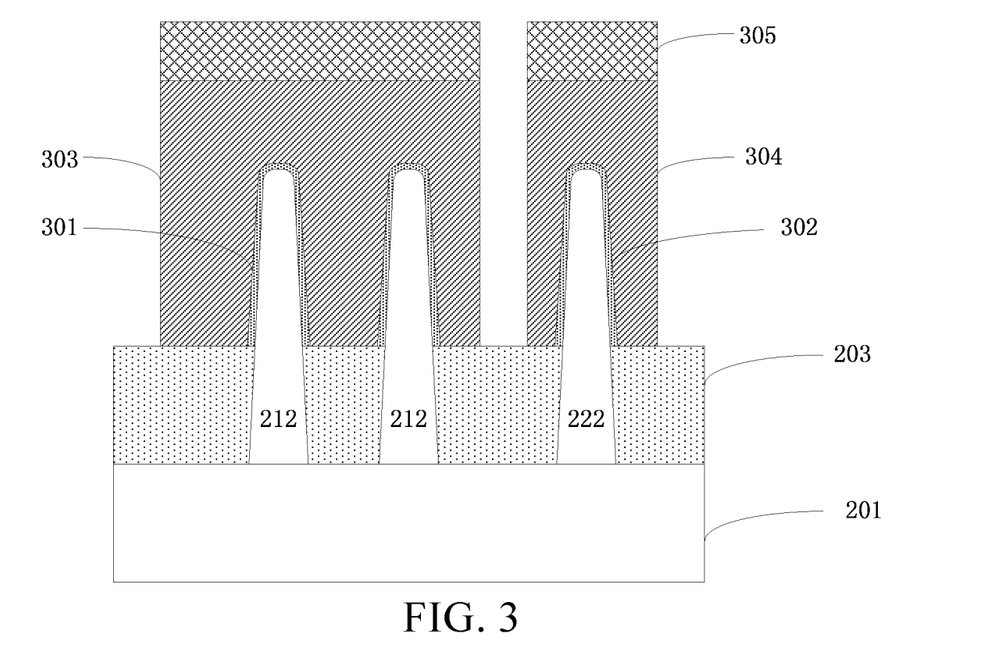

As shown in FIG. 3, a first pseudo gate dielectric layer 301 and a second pseudo gate dielectric layer 302, for example, a silicon oxide layer, are formed on surfaces of the first fin 212 and the second fin 222, respectively. Subsequently, a first pseudo gate 303 and a second pseudo gate 304 are formed on the first pseudo gate dielectric layer 301 and the second pseudo gate dielectric layer 302, respectively. The materials of the first pseudo gate 303 and the second pseudo gate 304 may be, for example, polysilicon.

In an implementation, a pseudo gate material (not shown in the figure) may be first deposited on the substrate structure after the first pseudo gate dielectric layer 301 and the second pseudo gate dielectric layer 302 are formed; then a patterned hard mask layer 305, for example, silicon nitride, is formed on the pseudo gate material; and subsequently, the pseudo gate material is etched by using the hard mask layer 305 as a mask, so as to form the first pseudo gate 303 and the second pseudo gate 304.

Figure 4:
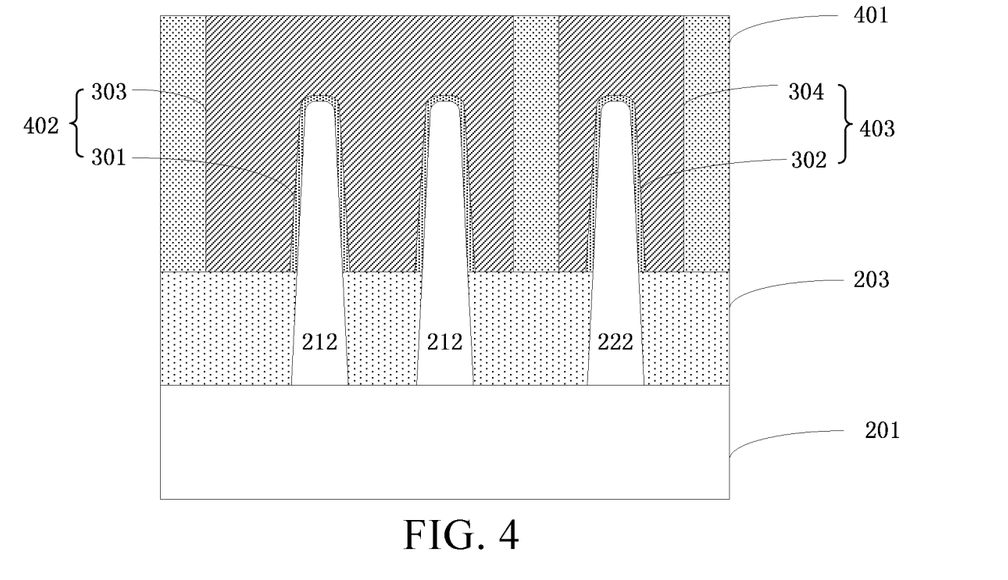

As shown in FIG. 4, an interlayer dielectric layer 401 is deposited, so as to fill a space around the first pseudo gate 303 and the second pseudo gate 304. Subsequently, a planarization process (for example, chemical mechanical planarization (CMP)) may be performed to remove the hard mask layer 305, and enable an upper surface of the interlayer dielectric layer 401, an upper surface of the first pseudo gate 303, and an upper surface of the second pseudo gate 304 to approximately flush with each other, that is, flush with each other within a process deviation range.

In this way, the substrate structure is formed. With reference to FIG. 4, the substrate structure may include a first fin 212 and a second fin 222 that are on the substrate 201 and that are separated. Herein, FIG. 4 schematically illustrates two first fins 212. However, it should be understood that this is not intended to limit the scope of this application. The isolation region 203 is provided around the first fin 212 and the second fin 222. An upper surface of the isolation region 203 is lower than upper surfaces of the first fin 212 and the second fin 222.

The substrate structure may further include a first pseudo gate structure 402 on the first fin 212 and a second pseudo gate structure 403 that is on the second fin and that is separated from the first pseudo gate structure 402. The first pseudo gate structure 402 may include the first pseudo gate dielectric layer 301 on the first fin 212 and the first pseudo gate 303 on the first pseudo gate dielectric layer 301. The second pseudo gate structure 403 may include the second pseudo gate dielectric layer 302 on the second fin 222 and the second pseudo gate 304 on the second pseudo gate dielectric layer 302.

The substrate structure may further include the interlayer dielectric layer 401 that is around the first pseudo gate structure 402 and the second pseudo gate structure 403. The upper surface of the interlayer dielectric layer 401 is approximately flush with the upper surfaces of the first pseudo gate 303 and the second pseudo gate 304.

After the substrate structure is formed, processes such as forming a source region and a drain region by means of pocket implant, LDD (Lightly Doped Drain) ion implantation, and epitaxial growth may be performed. However, content of this part is not a key point of this application, and therefore details are not described herein again.

Back to FIG. 1, in step 104: Remove a portion of a first pseudo gate to form a first recess, and remove a second pseudo gate structure to form a second recess, where an upper surface of a remaining portion of the first pseudo gate is higher than an upper surface of a first pseudo gate dielectric layer that is at a top portion of a first fin.

A specific implementation of step 104 is described below.

First, a first etching is performed. The first etching may be, for example, a dry etching.

Figure 5:
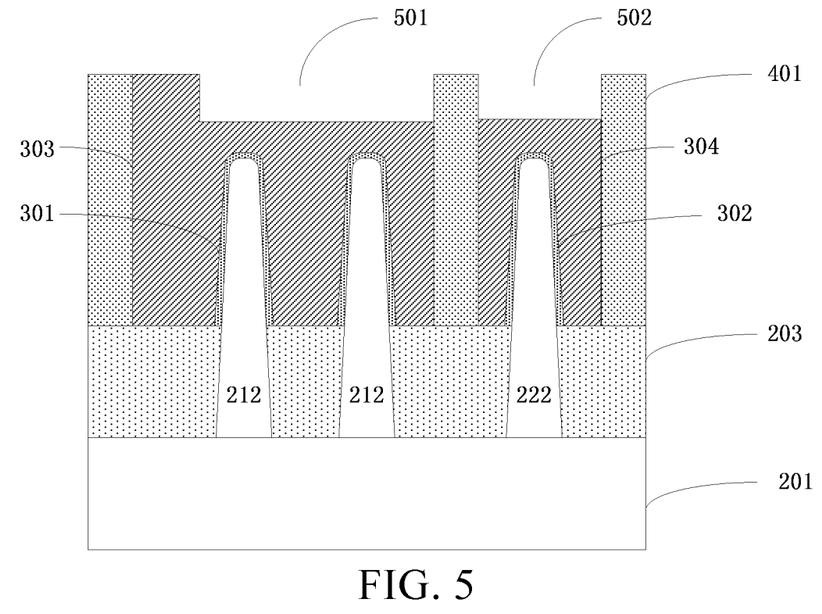

As shown in FIG. 5, the first etching may remove a portion of the first pseudo gate 303 to form a first recess 501. In some implementations, the remaining portion of the first pseudo gate 303 includes a first portion at a left side and a second portion at a right side. An upper surface of the first portion is approximately flush with that of the interlayer dielectric layer 401, and an upper surface of the second portion is a bottom portion of the first recess 501. The first portion herein may be a position for subsequently forming a contact that extends to the first pseudo gate 303.

The first etching may further remove a portion of the second pseudo gate 304 to form a third recess 502.

Subsequently, a second etching is performed. The second etching may be, for example, a wet etching.

Figure 6:
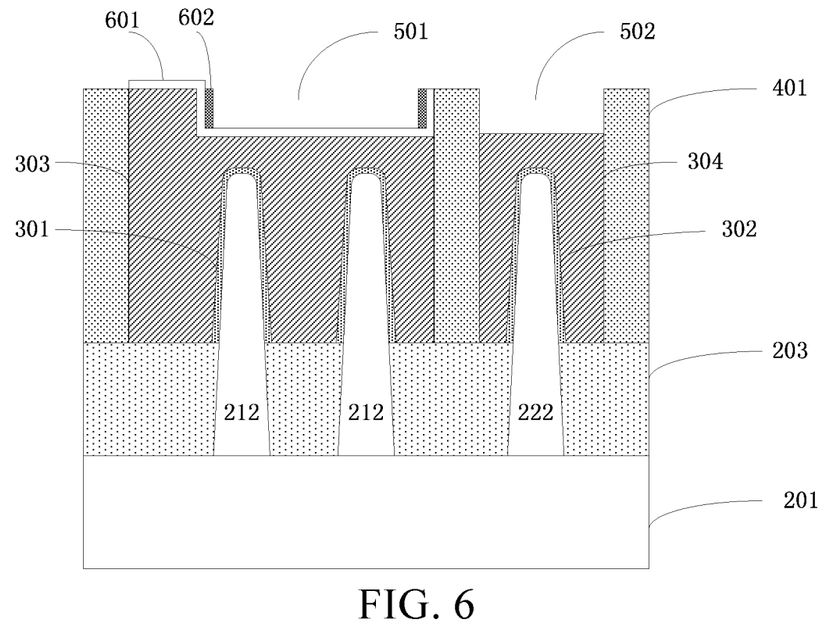

As shown in FIG. 6, a mask layer 601 may be formed on a bottom portion and a side wall of the first recess 501, so as to protect the remaining portion of the first pseudo gate 303 from being removed in a subsequent etching process. Preferably, after the mask layer 601 is formed, a spacer layer 602 may further be formed on the mask layer 601 that is on the side wall of the first recess 501. Therefore, a subsequently formed metal gate may be better separated from other components. Exemplarily, the material of the mask layer 601 may be an oxide, for example, an oxide of silicon. The material of the spacer layer 602 may be a nitride, for example, a nitride of silicon.

Figure 7:
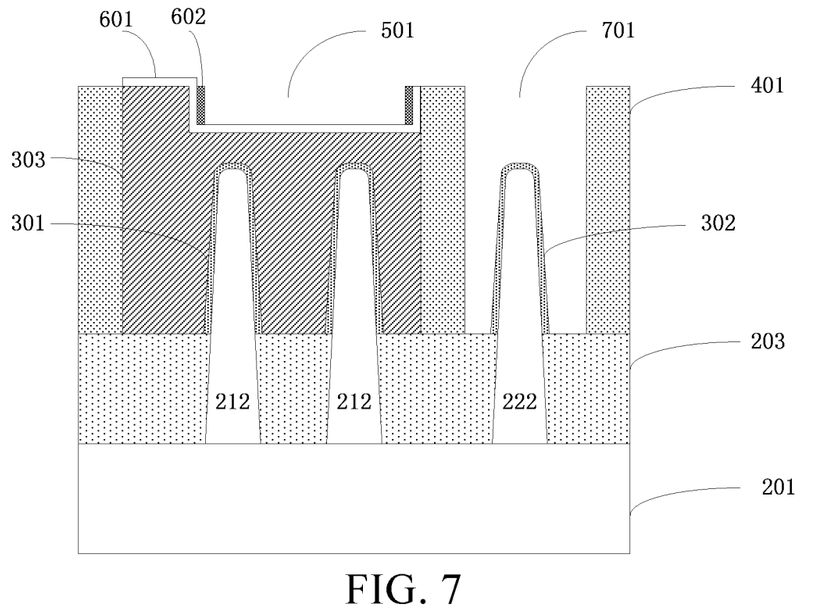

As shown in FIG. 7, the second etching is performed using the mask layer 601 as a mask. The second etching may remove a remaining portion of the second pseudo gate 304 to form a fourth recess 701.

Subsequently, a third etching is performed.

Figure 8:
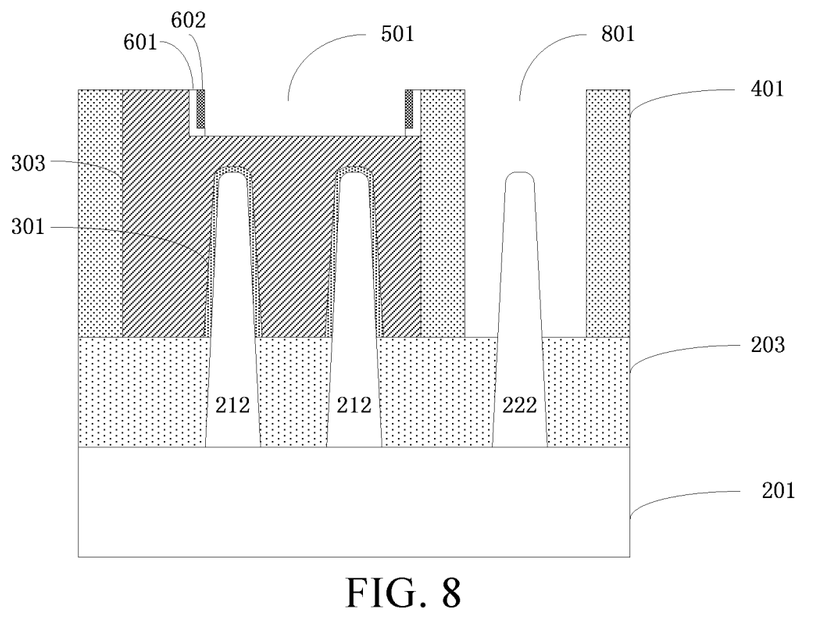

As shown in FIG. 8, the third etching may remove the second pseudo gate dielectric layer 302 to form a second recess 801. In some implementations, the third etching may further remove the mask layer 601 that is on the bottom portion of the first recess 501.

Referring again to FIG. 1, in step 106: Form a first metal gate stack structure in the first recess, and form a second metal gate stack structure in the second recess.

Figure 9:
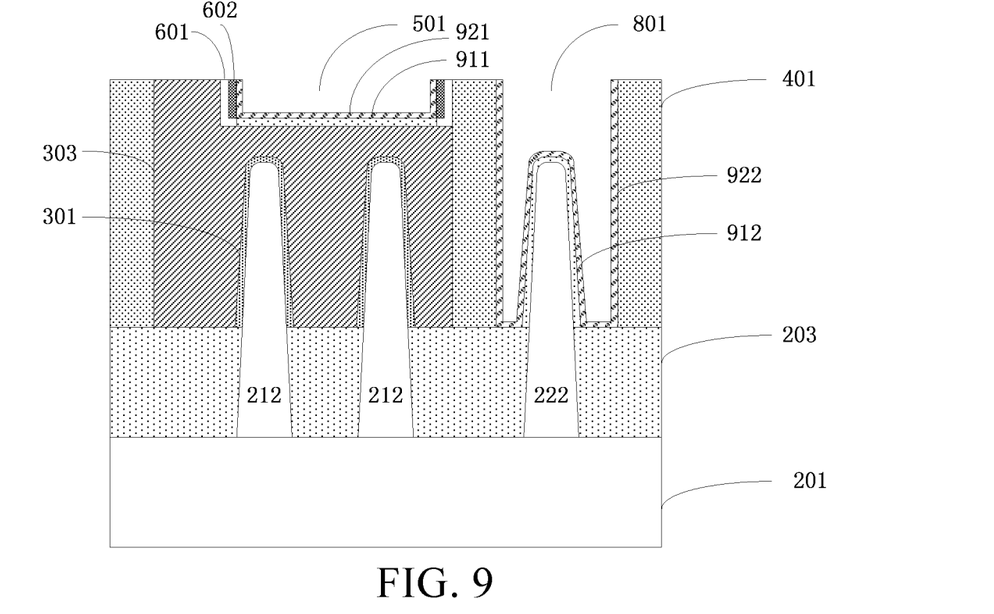

As shown in FIG. 9, a first interfacial layer 911 may be formed on the bottom portion of the first recess 501, and a second interfacial layer 912 may be formed on a surface of the second fin 222 that is in the second recess 801. For example, an oxide layer may be formed by means of thermal oxidation to serve as the first interfacial layer 911 and the second interfacial layer 912. After the first interfacial layer 911 is formed, a first gate dielectric layer 921, for example, a high-k dielectric layer made of hafnium dioxide, may be formed on the first interfacial layer 911 and the side wall of the first recess 501, that is, on the spacer layer 602 (if any). After the second interfacial layer 912 is formed, a second gate dielectric layer 922, for example, a high-k dielectric layer made of hafnium dioxide, may be formed on the second interfacial layer 912 and a bottom portion and a side wall of the second recess 801. Optionally, an annealing process may further be performed after the first gate dielectric layer 921 and the second gate dielectric layer 922 are formed.

Figure 10:
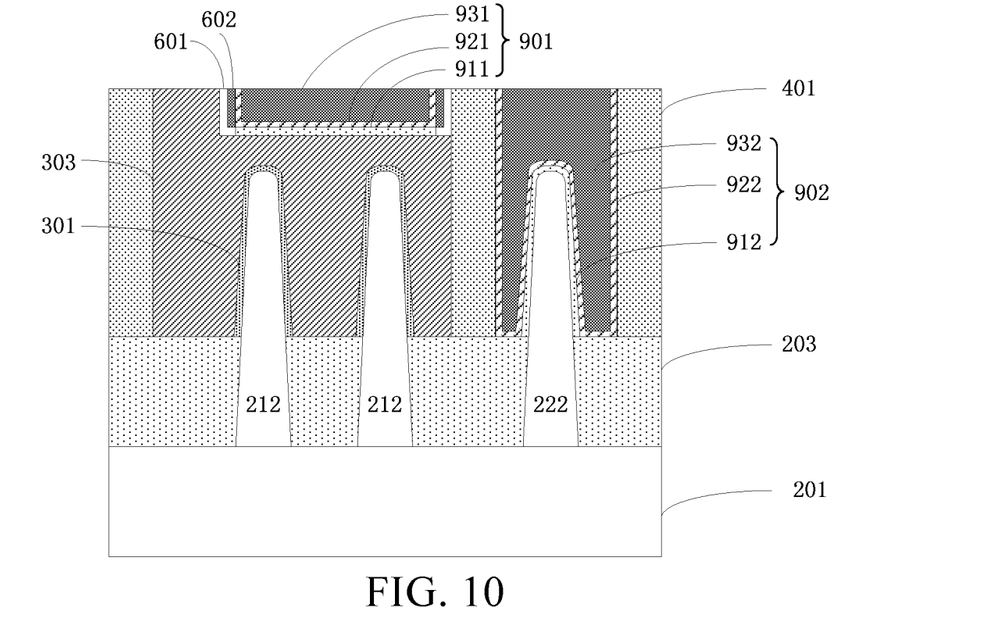

As shown in FIG. 10, a first metal gate 931 is formed on the first gate dielectric layer 921, and a second metal gate 932 is formed on the second gate dielectric layer 922. For example, a metal gate material, for example, tungsten, may be deposited on the structure shown in FIG. 9. Then, planarization, for example, CMP, is performed on the deposited metal gate material, so as to form the first metal gate 931 and the second metal gate 932.

In this way, a first metal gate structure 901 and a second metal gate structure 902 are formed.

The first metal gate stack structure 901 may include the first interfacial layer 911 that is on the bottom portion of the first recess 501, the first gate dielectric layer 921 that is on the first interfacial layer 911 and the side wall of the first recess 501, and the first metal gate 931 on the first gate dielectric layer 921. In some implementations, the first metal gate stack structure 901 may further include a barrier layer, a work function regulating layer, and the like between the first gate dielectric layer 921 and the first metal gate 931.

The second metal gate stack structure 902 may include the second interfacial layer 912 that is on the surface of the second fin 222, the second gate dielectric layer 922 that is on the second interfacial layer 912 and the bottom portion and the side wall of the second recess 801, and the second metal gate 932 on the second gate dielectric layer 922. In some implementations, the second metal gate stack structure 902 may further include a barrier layer, a work function regulating layer, and the like between the second gate dielectric layer 922 and the second metal gate 932.

Preferably, before the first metal gate stack structure 901 is formed in the first recess 501, the remaining portion of the first pseudo gate 303 that is below the bottom portion of the first recess 501 may further be doped, so as to reduce poly-Si depletion effect of the pseudo gate (for example, polysilicon). For example, the remaining portion of the first pseudo gate 303 that is below the bottom portion of the first recess 501 may be heavily doped by means of ion implantation. Doped impurities may include, but are not limited to, arsenic ions, phosphorus ions, boron ions, or boron difluoride ions.

Subsequently, a contact may further be formed according to actual conditions.

Figure 11:
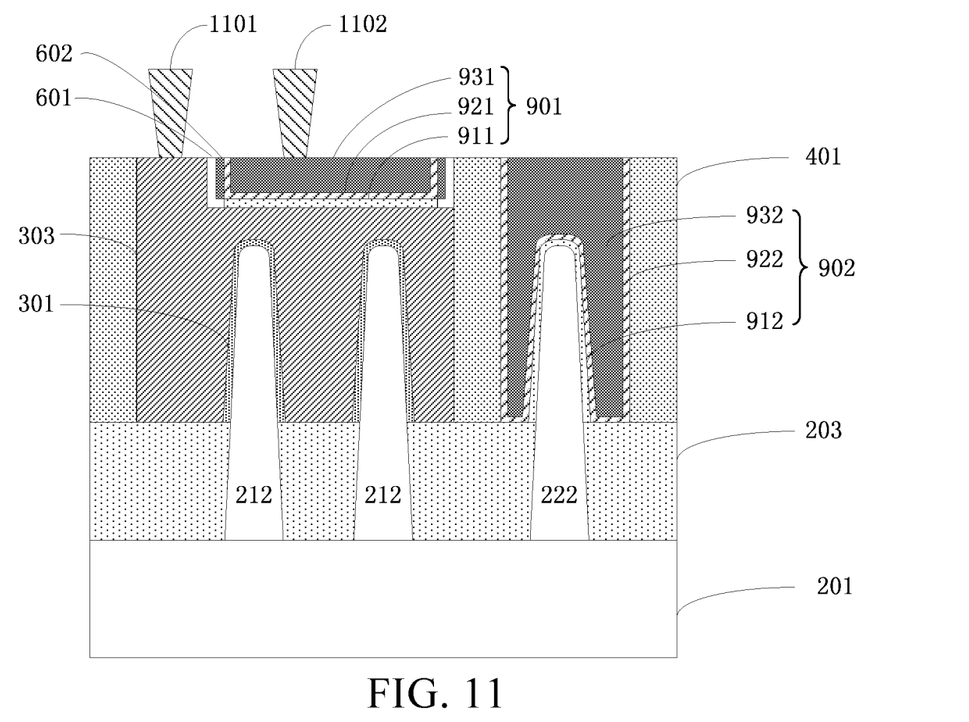

As shown in FIG. 11, a contact 1101 extending to the remaining portion of the first pseudo gate 303 (preferably being the first portion that is at the left side and that is approximately flush with the upper surface of the interlayer dielectric layer 401) and a contact 1102 extending to the first metal gate 931 may be formed. Preferably, before the contact 1102 is formed, a metal silicide may further be formed at a surface of the first pseudo gate 303. In addition, a contact extending to the first fin 212 (not shown in the figure) and a contact extending to the second metal gate 932 (not shown in the figure) may further be formed.

A method for manufacturing a semiconductor device is described above. In the foregoing manufacturing method, a first pseudo gate dielectric layer and a portion of a first pseudo gate are remained in a process of forming a FinFET based on a second fin, so that an MOS capacitor may be formed in the process of forming the FinFET.

Therefore, this application further provides an MOS capacitor. The MOS capacitor may be manufactured using, but is not limited to, the foregoing manufacturing method.

With reference to FIG. 9, FIG. 10, and FIG. 11, the MOS capacitor may further include the first fin 212 on a substrate 201.

The MOS capacitor may further include a first pseudo gate structure on the first fin 212. The first pseudo gate structure includes a first pseudo gate dielectric layer 301 on the first fin 212 and the first pseudo gate 303 on the first pseudo gate dielectric layer 301.

The MOS capacitor may further include the interlayer dielectric layer 401 around the first pseudo gate structure.

The interlayer dielectric layer 401 is provided with the first recess 501 that exposes the first pseudo gate 303 (with reference to FIG. 9).

The MOS capacitor may further include the first metal gate stack structure 901 in the first recess 501. A specific structure of the first metal gate stack structure 901 is described above, and details are not described herein again.

In the foregoing embodiments and forms, the MOS capacitor includes two capacitors. One capacitor is composed of the first fin 212, the first pseudo gate dielectric layer 301, and the first pseudo gate 303; and the other one is composed of the first pseudo gate 303, the first gate dielectric layer 921 in the first metal gate stack structure 901, and the first metal gate 931.

In some implementations, the first pseudo gate 303 may include a first portion and a second portion. An upper surface of the first portion is approximately flush with that of the interlayer dielectric layer 401, and an upper surface of the second portion is a bottom portion of the first recess 501. In some implementations, the MOS capacitor may further include the contact 1101 extending to the first portion (with reference to FIG. 11).

In some implementations, the MOS capacitor may further include the spacer layer 602 between the side wall of the first recess 501 and the first gate dielectric layer 921.

The present application further provides a semiconductor device that may include the MOS capacitor according to any one of the foregoing embodiments and forms. In some implementations, the semiconductor device may further include other components, for example, a FinFET and a fin type diode.

In some implementations, with reference to FIG. 11, the semiconductor device includes the MOS capacitor, and may further include a second fin 222 that is on a substrate 201 and that is separated from the first fin 212. In some implementations, the interlayer dielectric layer 401 may further be around the second fin 222, and is provided with a second recess 801 that exposes the second fin 222. A second metal gate stack structure 902 is provided in the second recess 801.

Figure 12:
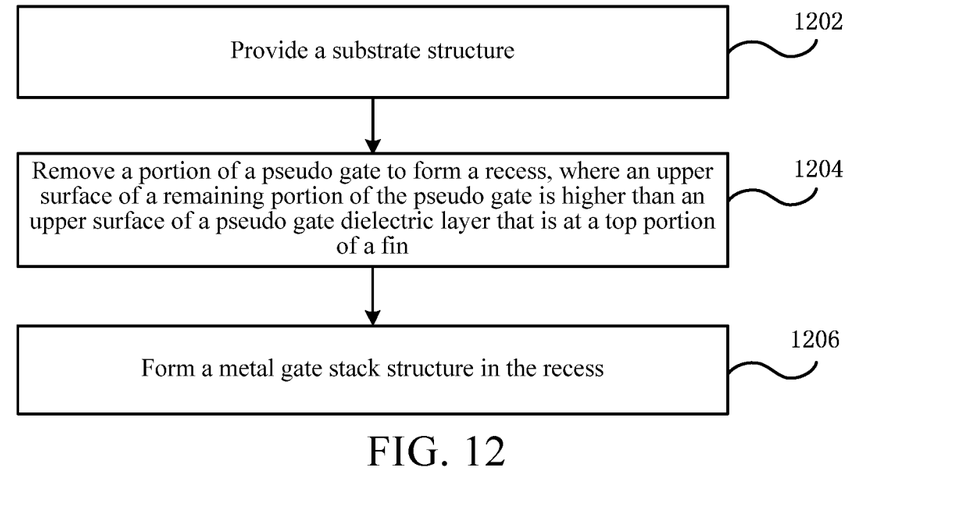
FIG. 12 is a simplified flowchart of a method for manufacturing an MOS capacitor.

FIG. 12 is a simplified flowchart of a method for manufacturing an MOS capacitor. FIG. 13 to FIG. 20 show schematic diagrams at phases of a method for manufacturing an MOS capacitor.

A method for manufacturing an MOS capacitor is described in detail below with reference to FIG. 12 and FIG. 13 to FIG. 20.

As shown in FIG. 1, first, in step 1202: Provide a substrate structure.

A specific implementation of forming the substrate structure is described below with reference to FIG. 13 to FIG. 15.

Figure 13:
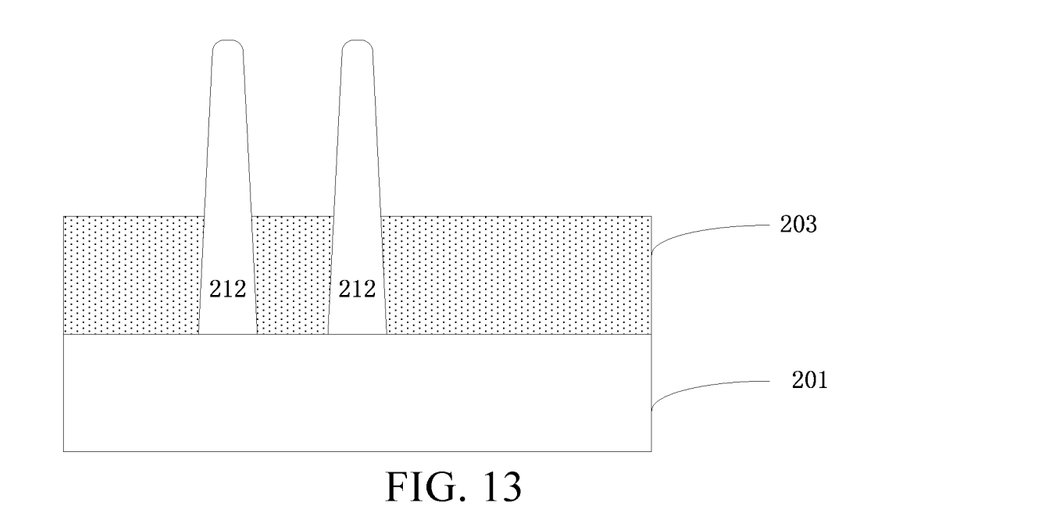
FIG. 13 to FIG. 20 show schematic diagrams at phases of a method for manufacturing an MOS capacitor.

As shown in FIG. 13, a fin 212 on a substrate 201 is formed. Herein, an isolation region 203 may be provided around the fin 212.

Figure 14:
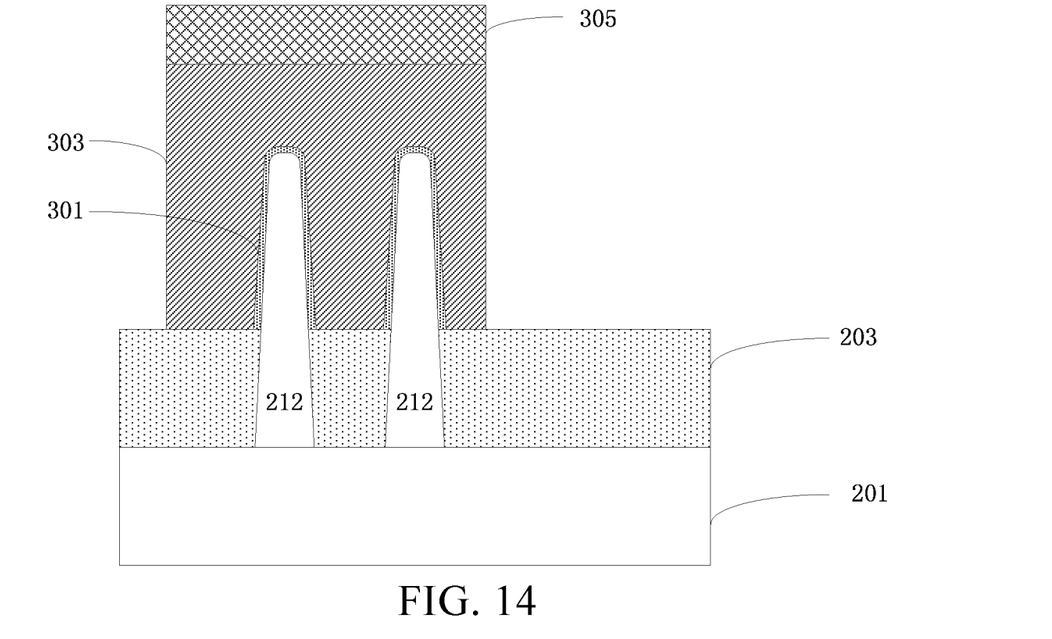

As shown in FIG. 14, a pseudo gate dielectric layer 301, for example, a silicon oxide layer, is formed on a surface of the fin 212. Subsequently, a pseudo gate 303, for example, polysilicon, is formed on the pseudo gate dielectric layer 301.

In an implementation, a pseudo gate material (not shown in the figure) may be first deposited on the substrate structure after the pseudo gate dielectric layer 301 is formed; then a patterned hard mask layer 305 is formed on the pseudo gate material; and subsequently, the pseudo gate material is etched by using the hard mask layer 305 as a mask, so as to form the pseudo gate 303.

Figure 15:
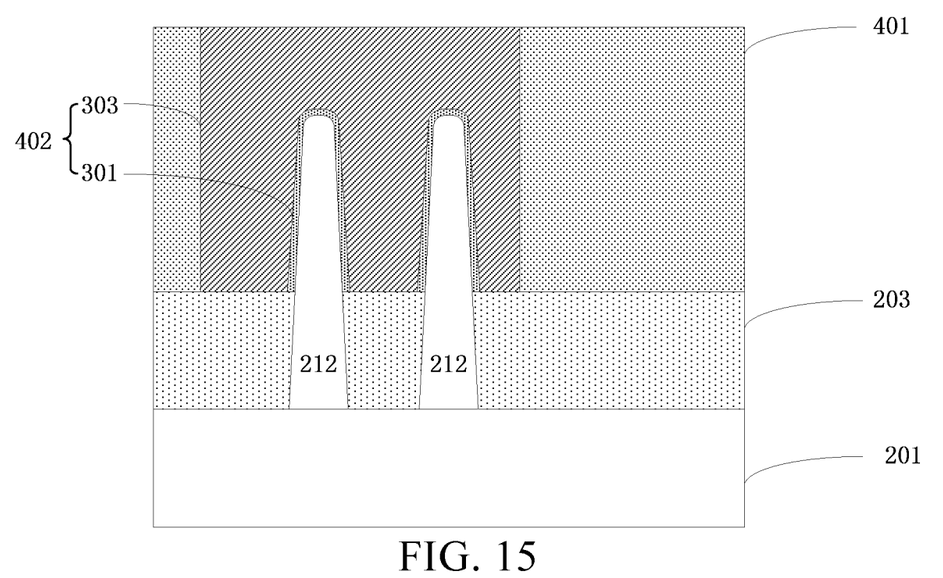

As shown in FIG. 15, an interlayer dielectric layer 401 is deposited on the structure shown in FIG. 14, so as to cover the pseudo gate 303 and the hard mask layer 305. Subsequently, a planarization process, for example, CMP, may be performed to remove the hard mask layer 305. Therefore, an upper surface of the interlayer dielectric layer 401 is approximately flush with that of the pseudo gate 303.

In this way, the substrate structure is formed. As shown in FIG. 15, the substrate structure may include the fin 212 on the substrate 201. Herein, FIG. 4 schematically illustrates two fins 212. However, it should be understood that this is not intended to limit the scope of this application. The isolation region 203 may be provided around the fin 212, and an upper surface of the isolation region 203 is lower than that of the fin 212.

The substrate structure may further include a pseudo gate structure 402 on the fin 212. The pseudo gate structure 402 may include the pseudo gate dielectric layer 301 on the fin 212 and the pseudo gate 303 on the pseudo gate dielectric layer 301.

The substrate structure may further include the interlayer dielectric layer 401 around the pseudo gate structure 402. The upper surface of the interlayer dielectric layer 401 approximately flushes with that of the pseudo gate 303.

Figure 16:
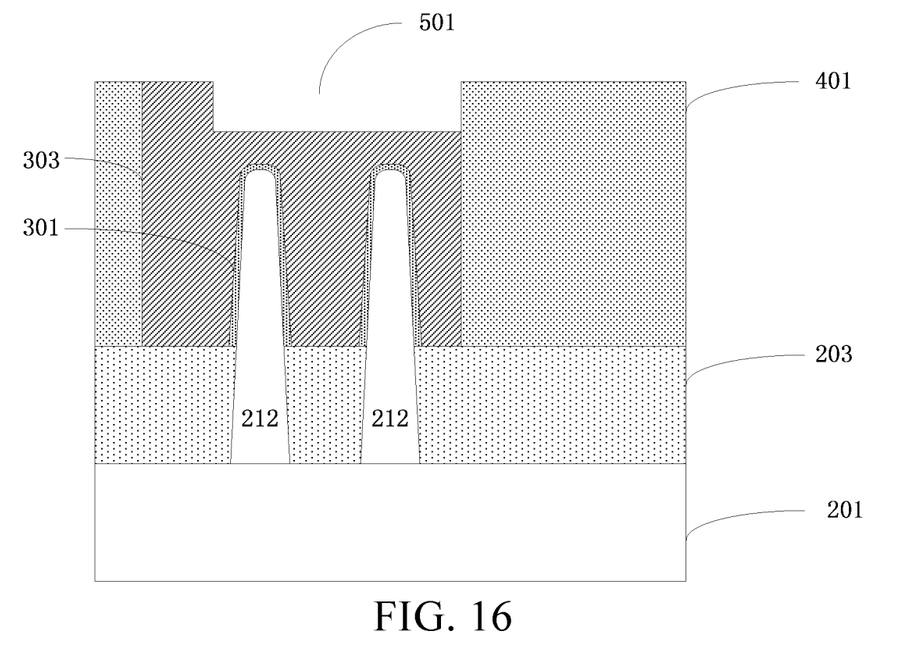

Referring again to FIG. 1, in step 1204: Remove a portion of a pseudo gate 303 to form a recess 501, where an upper surface of a remaining portion of the pseudo gate 303 is higher than an upper surface of a pseudo gate dielectric layer 301 that is at a top portion of a fin 212, as shown in FIG. 16.

In some implementations, the remaining portion of the pseudo gate 303 includes a first portion at a left side and a second portion at a right side. An upper surface of the first portion is approximately flush with that of the interlayer dielectric layer 401, and an upper surface of the second portion is a bottom portion of the recess 501. The first portion herein may be a position for subsequently forming a contact that extends to the pseudo gate 303.

Figure 17:
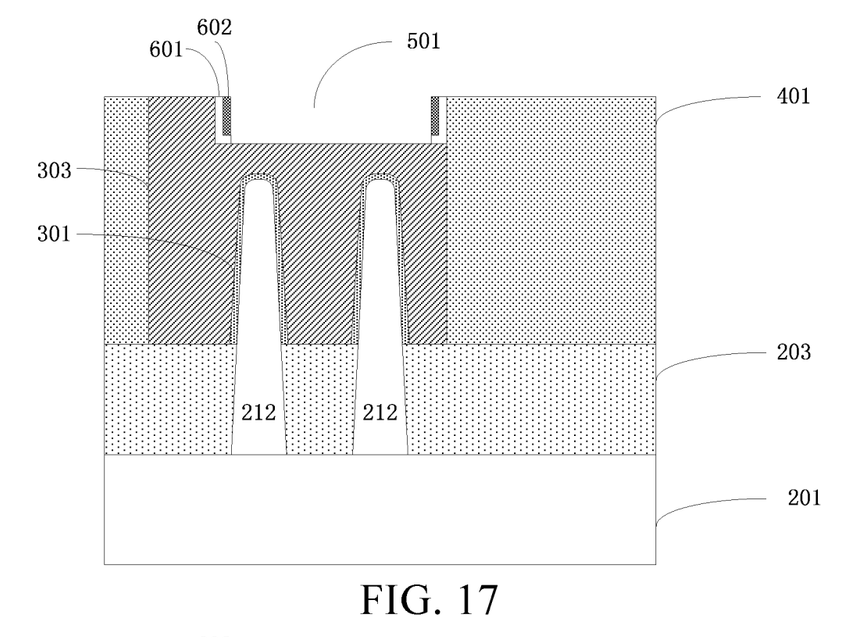

In step 1206: Form a metal gate stack structure 901 in the recess 501. As shown in FIG. 17, a spacer layer 602, for example, a nitride, may be formed on a side wall of the recess 501. In addition, there may be an oxide layer between the spacer layer 602 and the side wall of the recess 501.

Figure 18:
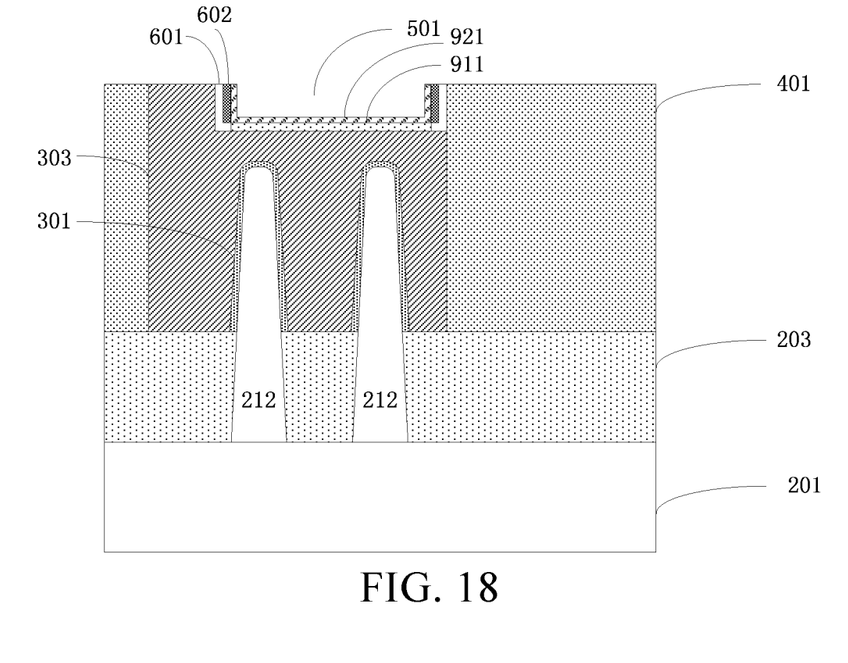

As shown in FIG. 18, an interfacial layer 911 may be formed on a bottom portion of the recess 501. For example, an oxide layer may be formed by means of thermal oxidation to serve as the interfacial layer 911. After the interfacial layer 911 is formed, a gate dielectric layer 921, for example, a high-k dielectric layer made of hafnium dioxide, may be formed on the interfacial layer 911 and the side wall of the recess 501, that is, on the spacer layer 602 (if any). Optionally, an annealing process may further be performed after the gate dielectric layer 921 is formed.

Figure 19:
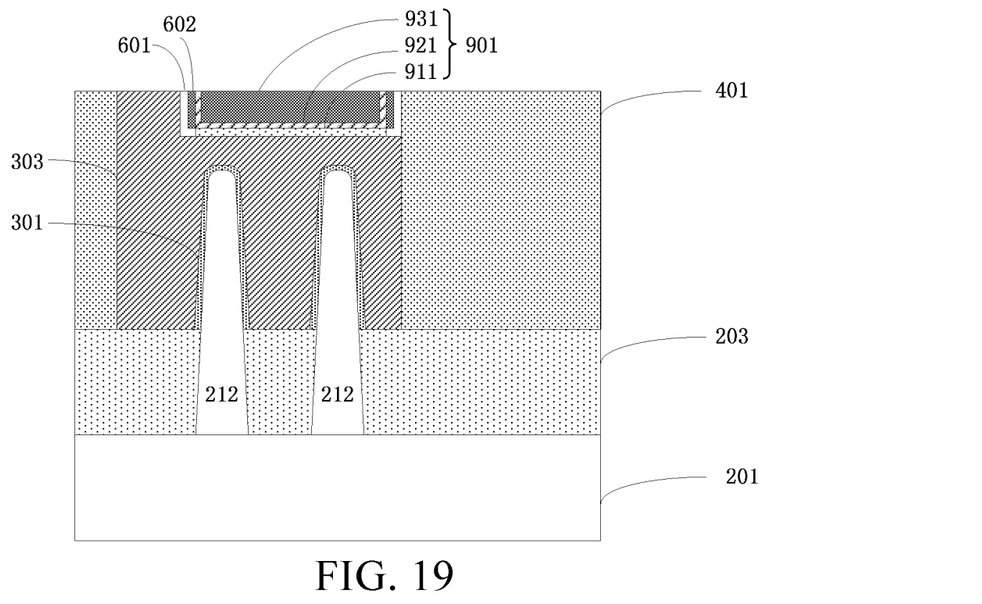

As shown in FIG. 19, a metal gate 931 is formed on the gate dielectric layer 921. For example, a metal gate material, for example, tungsten, may be deposited on the structure shown in FIG. 18. Then, planarization, for example, CMP, is performed on the deposited metal gate material, so as to form the metal gate 931.

In this way, a metal gate structure 901 is formed. The metal gate stack structure 901 may include the interfacial layer 911 that is on the bottom portion of the recess 501, the gate dielectric layer 921 that is on the interfacial layer 911 and the side wall of the first recess 501, and the metal gate 931 on the first gate dielectric layer 921. In some implementations, the metal gate stack structure 901 may further include a barrier layer, a work function regulating layer, and the like between the gate dielectric layer 921 and the metal gate 931.

In some implementations, before the metal gate stack structure 901 is formed in the recess 501, the remaining portion of the pseudo gate 303 that is below the bottom portion of the recess 501 may further be doped, so as to reduce poly-Si depletion effect of the pseudo gate (for example, polysilicon).

Subsequently, a contact may further be formed according to actual conditions.

Figure 20:
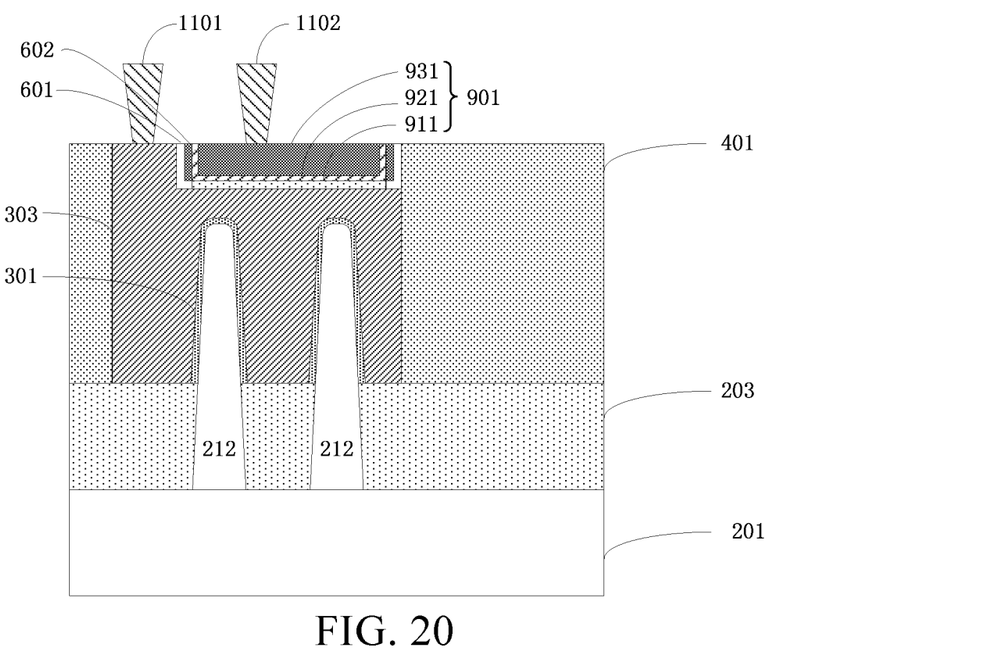

As shown in FIG. 20, a contact 1101 extending to the remaining portion of the pseudo gate 303 (in some instances being the first portion that is at the left side and that is approximately flush with the upper surface of the interlayer dielectric layer 401) and a contact 1102 extending to the metal gate 931 may be formed. In addition, a contact extending to the fin 212 (not shown in the figure) may further be formed (not shown in the figure).

Heretofore, the semiconductor device, the MOS capacitor, and the manufacturing methods therefor according to embodiments and forms of this application are described in detail. In describing the application, some details generally known in the art are not described. According to the foregoing descriptions, a person skilled in the art may completely understand how to implement the technical solutions disclosed herein. In addition, the embodiments and forms according to the teaching disclosed in the specification may be freely combined. A person skilled in the art should understand that various amendments can be made to the embodiments described above without departing from the scope and the spirit of this application that are defined by the appended claims.

What is claimed is:

1. A method for manufacturing a semiconductor device, comprising:
  providing a substrate structure, wherein the substrate structure comprises:
  a first fin and a second fin that are positioned on the substrate and that are separated;
  a first pseudo gate structure positioned on the first fin, the first pseudo gate comprising a first pseudo gate dielectric layer positioned on the first fin and a first pseudo gate positioned on the first pseudo gate dielectric layer;
  a second pseudo gate structure that is positioned on the second fin and that is separated from the first pseudo gate structure, the second pseudo gate structure comprising a second pseudo gate dielectric layer positioned on the second fin and a second pseudo gate positioned on the second pseudo gate dielectric layer; and
  an interlayer dielectric layer positioned around the first pseudo gate structure and the second pseudo gate structure, wherein an upper surface of the interlayer dielectric layer is approximately flush with an upper surface of the first pseudo gate and an upper surface of the second pseudo gate;
  removing a portion of the first pseudo gate to form a first recess, and removing the second pseudo gate structure to form a second recess, wherein an upper surface of a remaining portion of the first pseudo gate is higher than an upper surface of the first pseudo gate dielectric layer that is at a top portion of the first fin; and
  forming a first metal gate stack structure in the first recess, and forming a second metal gate stack structure in the second recess.

2. The method according to claim 1, wherein removing a portion of the first pseudo gate to form a first recess, and removing the second pseudo gate structure to form a second recess comprises:

performing a first etching, wherein the first etching removes a portion of the first pseudo gate to form the first recess, and removes a portion of the second pseudo gate to form a third recess;

performing a second etching, wherein the second etching removes a remaining portion of the second pseudo gate to form a fourth recess; and performing a third etching, wherein the third etching removes the second pseudo gate dielectric layer, so as to form the second recess.

3. The method according to claim 2, wherein performing a second etching comprises:

forming a mask layer at a bottom portion and a side wall of the first recess; and performing the second etching by using the mask layer as a mask.

4. The method according to claim 3, further comprising: forming, after the mask layer is formed, a spacer layer on the mask layer that is at the side wall of the first recess.

5. The method according to claim 4, wherein:

the third etching further removes the mask layer that is on the bottom portion of the first recess.

6. The method according to claim 4, wherein:

the material of the mask layer comprises an oxide; and
the material of the spacer layer comprises a nitride.

7. The method according to claim 1, wherein:

the remaining portion of the first pseudo gate comprises a first portion and a second portion, an upper surface of the first portion is approximately flush with that of the interlayer dielectric layer, and the upper surface of the second portion is a bottom portion of the first recess.

8. The method according to claim 7, further comprising: forming a contact that extends to the first portion.

9. The method according to claim 1, further comprising: doping, before forming a first metal gate stack structure in the first recess, the remaining portion of the first pseudo gate that is below a bottom portion of the first recess.

10. The method according to claim 1, wherein the first metal gate stack structure comprises:

a first interfacial layer at a bottom portion of the first recess;

a first gate dielectric layer positioned on the first interfacial layer and a side wall of the first recess; and a first metal gate positioned on the first gate dielectric layer.

11. The method according to claim 1, wherein the second metal gate stack structure comprises:

a second interfacial layer at a surface of the second fin;

a second gate dielectric layer positioned on the second interfacial layer and a bottom portion and a side wall of the second recess; and a second metal gate on the second gate dielectric layer.

12. A method for manufacturing an MOS capacitor, comprising:

providing a substrate structure, wherein the substrate structure comprises:

a fin on a substrate;

a pseudo gate structure positioned on the fin, the pseudo gate structure comprising a pseudo gate dielectric layer positioned on the fin and a pseudo gate positioned on the pseudo gate dielectric layer; and an interlayer dielectric layer positioned around the pseudo gate structure, wherein an upper surface of the interlayer dielectric layer is approximately flush with that of the pseudo gate;

removing a portion of the pseudo gate to form a recess, wherein an upper surface of a remaining portion of the pseudo gate is higher than an upper surface of the pseudo gate dielectric layer that is at a top portion of the fin, the remaining portion of the pseudo gate comprises a first portion and a second portion, an upper surface of the first portion is approximately flush with that of the interlayer dielectric layer, and an upper surface of the second portion is a bottom portion of the recess; and forming a metal gate stack structure in the recess.

13. The method according to claim 12, further comprising:

forming a contact that extends to the first portion.

14. The method according to claim 12, further comprising:

forming a spacer layer at a side wall of the recess before the forming a metal gate stack structure in the recess.

15. The method according to claim 12, further comprising:

doping, before forming a metal gate stack structure in the recess, the remaining portion of the pseudo gate that is below a bottom portion of the recess.

16. The method according to claim 12, wherein the metal gate stack structure comprises:

an interfacial layer at a bottom portion of the recess;

a gate dielectric layer at the interfacial layer and a side wall of the recess; and a metal gate on the gate dielectric layer.

* * * * *